(12) United States Patent  
Kanamura et al.

(10) Patent No.: US 8,357,602 B2  
(45) Date of Patent: Jan. 22, 2013

(54) COMPOUND SEMICONDUCTOR DEVICE AND METHOD OF MANUFACTURING THE SAME

(75) Inventors: Masahito Kanamura, Kawasaki (JP); Toshihide Kikkawa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 262 days.

(21) Appl. No.: 12/886,822

(22) Filed: Sep. 21, 2010

(65) Prior Publication Data

US 2011/0079771 A1   Apr. 7, 2011

(30) Foreign Application Priority Data

Oct. 2, 2009 (JP) ................................ 2009-230877

(51) Int. Cl.  
*H01L 21/3205* (2006.01)  
*H01L 21/461* (2006.01)

(52) U.S. Cl. .. 438/590; 438/790; 438/285; 257/E21.697

(58) Field of Classification Search .................. 438/285, 438/590, 740; 257/E21.697  
See application file for complete search history.

(56) References Cited

U.S. PATENT DOCUMENTS

| | | | | |
|---|---|---|---|---|
| 6,479,843 B2 * | 11/2002 | Huang et al. | .................. | 257/192 |
| 7,326,971 B2 * | 2/2008 | Harris et al. | .................. | 257/194 |
| 7,429,534 B2 * | 9/2008 | Gaska et al. | .................. | 438/705 |
| 7,838,904 B2 * | 11/2010 | Nakazawa et al. | ............ | 257/194 |
| 2003/0116774 A1 * | 6/2003 | Yamamoto et al. | ............. | 257/94 |
| 2004/0245917 A1 * | 12/2004 | Lu et al. | .......................... | 313/503 |
| 2006/0281238 A1 | 12/2006 | Harris et al. | | |
| 2008/0006845 A1 | 1/2008 | Derluyn | | |
| 2008/0237605 A1 | 10/2008 | Murata | | |
| 2008/0258243 A1 | 10/2008 | Kuroda | | |
| 2008/0283870 A1 | 11/2008 | Sato | | |
| 2009/0008677 A1 | 1/2009 | Kikkawa | | |
| 2010/0184262 A1 * | 7/2010 | Smorchkova et al. | ........ | 438/172 |
| 2011/0018040 A1 * | 1/2011 | Smith et al. | .................... | 257/288 |
| 2011/0049526 A1 * | 3/2011 | Chu et al. | ......................... | 257/76 |
| 2011/0073910 A1 * | 3/2011 | Takizawa et al. | ............. | 257/192 |
| 2011/0140121 A1 * | 6/2011 | Lee et al. | ......................... | 257/76 |
| 2011/0241088 A1 * | 10/2011 | Sato et al. | ..................... | 257/288 |
| 2012/0146097 A1 * | 6/2012 | Endo et al. | ..................... | 257/194 |

FOREIGN PATENT DOCUMENTS

| | | |
|---|---|---|
| JP | 2005-183733 A | 7/2005 |
| JP | 2007-329483 A1 | 12/2007 |
| JP | 2008-270521 A1 | 11/2008 |
| JP | 2008-270794 A1 | 11/2008 |
| WO | WO 2007/108055 A1 | 9/2007 |

OTHER PUBLICATIONS

European Search Report dated Aug. 17, 2011 corresponding to European Patent Application No. 10181240.2.

* cited by examiner

*Primary Examiner* — Jarrett Stark

(74) *Attorney, Agent, or Firm* — Kratz, Quintos & Hanson, LLP

(57) ABSTRACT

An intermediate layer composed of i-AlN is formed between a channel layer and an electron donor layer, a first opening is formed in an electron donor layer, at a position where a gate electrode will be formed later, while using an intermediate layer as an etching stopper, a second opening is formed in the intermediate layer so as to be positionally aligned with the first opening, by wet etching using a hot phosphoric acid solution, and a gate electrode is formed so that the lower portion thereof fill the first and second openings while placing a gate insulating film in between, and so that the head portion thereof projects above the cap structure.

8 Claims, 9 Drawing Sheets

RELATION BETWEEN DEPTH OF ETCHING AND THRESHOLD VOLTAGE

CONTROL OF THRESHOLD VOLTAGE

| | VARIATION IN DEPTH OF ETCHING | VARIATION IN THRESHOLD VOLTAGE |
|---|---|---|
| SAMPLE 1 | 3nm | 1V |
| SAMPLE 2 | 0.2nm | 0.06V (DETERMINED BASED ON VARIATION IN CRYSTALLINITY) |

US 8,357,602 B2

COMPOUND SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No. 2009-230877, filed on Oct. 2, 2009, the entire contents of which are incorporated herein by reference.

FIELD

The present embodiments relate to a compound semiconductor device having a channel layer and an electron donor layer, which are composed of compound semiconductors such as nitride semiconductors, and a method of manufacturing the same.

BACKGROUND

AlGaN/GaNFET (field effect transistor), a sort of compound semiconductor device making use of hetero-junction of AlGaN/GaN representing nitride compound semiconductor, and using a GaN layer as a channel layer, has vigorously been developed in these years, typically as found in Japanese Laid-Open Patent Publication Nos. 2007-329483, 2008-270521 and 2008-270794, and in International Publication Pamphlet No. WO 2007/108055. GaN is characterized by its wide band gap, high breakdown field strength and large saturation electron velocity, and is a great hope for material composing semiconductors capable of high-voltage and high-output operation. For this reason, the AlGaN/GaN FET is now under vigorous development, in pursuit of high-efficiency switching device for the next generation.

SUMMARY

Switching devices intended for use as a power source is required to operate in so-called, normally-off mode, under which no current flows when no voltage is applied.

In general, the AlGaN/GaN FET tends to increase in the amount of electron in the channel, due to piezoelectric effect. It is, therefore, necessary for the AlGaN/GaN FET to reduce the amount of electron in the channel, in order to ensure the normally-off operation.

Thinning of the electron donor layer, and adoption of a gate recess structure have been discussed as techniques for ensuring the normally-off operation of AlGaN/GaN FET. The gate recess structure is characterized by a structure obtained by forming an opening in an electron donor layer, at a position where a gate electrode will be formed later, and forming the gate electrode so as to fill the opening, while making the top thereof projected above the opening.

However, with the thinning of the electron donor layer, it is intrinsically difficult to ensure large-current operation and low on-resistance, both of which are advantages of the AlGaN/GaN FET. It is, therefore, not appropriate to adopt the countermeasure.

When the gate-recess structure is adopted, as illustrated in FIG. 1, an opening is formed in an electron donor layer over a channel layer, at a position where the gate electrode will be formed later, by dry etching. Since the channel layer is composed of a GaN layer, and the electron donor layer is composed of an AlGaN layer, so that it is difficult to precisely control the depth of opening in the process of dry etching.

Moreover, the bottom of the opening indicated by a circle C in the drawing is damaged by the etching, showing a heavily degraded surface morphology (generation of surface irregularity) enough to mask so-called atomic layer steps (difference of height of atomic layers which resides on the crystal surface). If the gate electrode is formed in the opening while placing in between a gate insulating film, which covers the inner wall surface of the opening, and while leaving the surface irregularity at the bottom unsmoothened, the electric field may heavily be concentrated to the projected portions, and thereby breakdown voltage of the gate electrode may considerably be degraded.

As described in the above, the gate recess structure of the AlGaN/GaN FET may successfully ensure the normally-off operation, whereas difficulty in controlling the depth of recess to be formed in the electron donor layer, and possible degradation in voltage resistance due to etching damage caused in the process of formation the recess, are anticipated.

According to one aspect of the present embodiment, there is provided a compound semiconductor device which includes: a channel layer containing a Group III-V nitride semiconductor; an AlN layer formed over the channel layer, and having a first opening allowing the channel layer to expose therein; an electron donor layer formed over the AlN layer, having a second opening allowing the channel layer to expose therein through the first opening, and containing a Group III-V nitride semiconductor; and agate electrode formed above the channel layer so as to fill the first opening and the second opening.

According to another aspect of the present embodiment, there is provided a method of manufacturing a compound semiconductor device which includes: forming a channel layer containing a Group III-V nitride semiconductor; forming an AlN layer over the channel layer; forming an electron donor layer containing a Group III-V nitride semiconductor over the AlN layer; forming a first opening in the electron donor layer so as to allow the AlN layer to expose therein; forming a second opening in the AlN layer through the first opening so as to allow the channel layer to expose therein; and forming a gate electrode over the channel layer, so as to fill the first opening and the second opening.

According to the above-described aspects, a highly-reliable compound semiconductor device, capable of stabilizing the threshold voltage with a small variation, and attaining a sufficient level of breakdown voltage, even if the gate recess structure is adopted to enable the normally-off operation, may be obtained.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Specific embodiments will be detailed below, referring to the attached drawings. In the embodiments below, the compound semiconductor device is exemplified by an AlGaN/GaN FET, and a configuration thereof will be explained in conjunction with a method of manufacturing. Note that the compound semiconductor device of the present embodiment may be applicable not only to the AlGaN/GaN FET, but also to other Group III-V nitride semiconductor devices such as those composed of InAlN, InGaAlN and so forth.

(First Embodiment)

FIGS. 2A to 4B are schematic sectional views sequentially illustrating processes of a method of manufacturing a compound semiconductor device according to a first embodiment.

Figure 1:
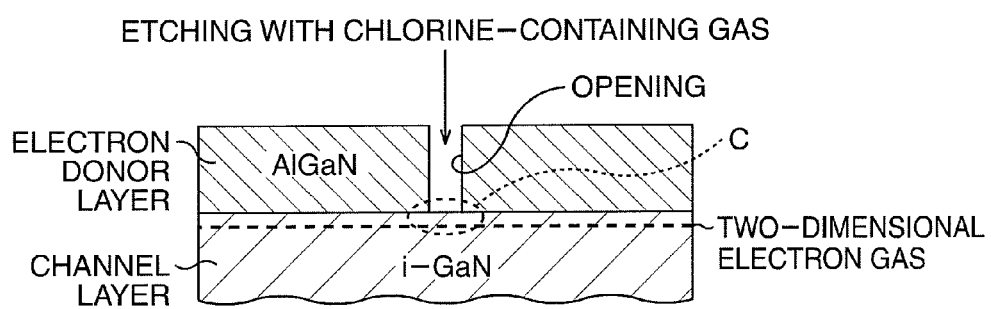
FIG. 1 is a schematic sectional view explaining a problem in the gate recess structure.
Figure 2A:
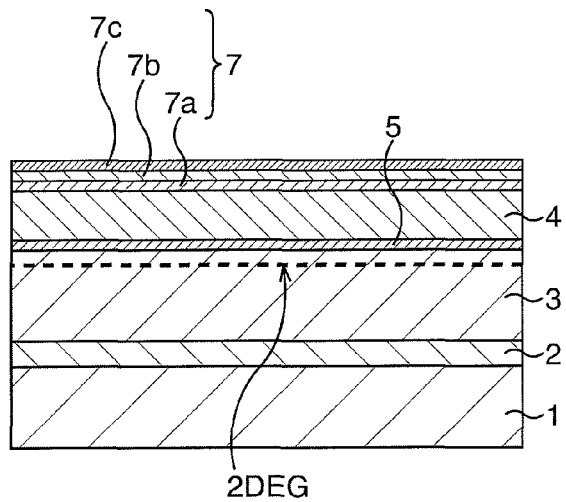
FIGS. 2A, 2B, 2C, 3A, 3B, 3C, 4A and 4B are schematic sectional views sequentially illustrating processes of a method of manufacturing a compound semiconductor device according to a first embodiment.

First, as illustrated in FIG. 2A, a nucleation layer 2, a channel layer 3, an intermediate layer 5, an electron donor layer 4, and a cap structure 7 are sequentially formed typically on a SiC substrate 1.

In this embodiment, the nucleation layer 2 is composed of an intentionally undoped AlN (i-AlN) layer, the channel layer 3 is composed of an intentionally undoped GaN (i-GaN) layer, the intermediate layer 5 is composed of an AlN layer (i-AlN layer in this case), and the electron donor layer 4 is composed of an intentionally undoped AlGaN (i-AlGaN) layer. The electron donor layer 4 may alternatively be composed of an n-AlGaN layer.

The cap structure 7 is composed of a first AlGaN layer, a second AlGaN layer, and a third AlGaN layer stacked in this order. The second AlGaN layer has an Al content larger than that in the first AlGaN layer and the third AlGaN layer.

In this embodiment, the first AlGaN layer and the third AlGaN layer do not contain Al, and the second AlGaN layer does not contain Ga. More specifically, the cap structure 7 is composed of a first layer 7a, a second layer 7b, and a third layer 7c stacked in this order, wherein the first layer 7a is composed of an n-type impurity doped GaN (n-GaN) layer, the second layer 7b is composed of an i-AlN layer, and the third layer 7c is composed of an n-GaN layer.

In the AlGaN/GaN FET, a two-dimensional electron gas (2DEG) is formed in the channel layer 3, in the vicinity of the interface between itself and the electron donor layer 4 (or the intermediate layer 5 in a direct sense). In FIG. 2A and succeeding drawings, the 2DEG will be expressed by a broken line.

By providing the cap structure 7, crystal distortion increases between the channel layer 3 and the electron donor layer 4, and thereby the piezoelectric effect is induced enough to increase the 2DEG. In this way, the on-current of the AlGaN/GaN FET may be reduced, and thereby operation under large current may be ensured.

In FIG. 2A, for more details, the individual compound semiconductor layers described below are grown typically by MOVPE (Metal Organic Vapor Phase Epitaxy) using a crystal growth apparatus, typically on a substrate such as the SiC substrate 1.

In this case, the individual layers of i-AlN, i-GaN, i-AlN, i-AlGaN, and n-GaN/i-AlN/n-GaN are sequentially stacked on the SiC substrate 1, to thereby form the nucleation layer 2, the channel layer 3, the intermediate layer 5, the electron donor layer 4, and the cap structure 7 in a stacked manner. The nucleation layer 2 formed herein is approximately 0.1 μm thick, the channel layer 3 is approximately 3 μm thick, the intermediate layer 5 is approximately 2 nm thick, and the electron donor layer 4 is approximately 20 nm thick with the composition $Al_xGa_{1-x}N$ (0<x<1) thereof typically expressed as $Al_{0.25}Ga_{0.75}N$. In the cap structure 7, the first layer 7a formed herein is approximately 2 nm thick, the second layer 7b is approximately 2 nm thick, and the third layer 7c is approximately 2 nm thick.

As for conditions of growth of the above-described i-AlN, i-GaN, i-AlGaN and n-GaN layers, a mixed gas of trimethyl aluminum gas, trimethyl gallium gas, and ammonia gas is used as a source gas, wherein use or disuse, and flow rate of trimethyl aluminum gas as an Al source, and trimethyl gallium gas as a Ga source are appropriately adjusted, depending on compositions of the compound semiconductor layers to be grown. The flow rate of ammonia gas, which is a common source gas, is adjusted in the range from 100 ccm to 10 LM or around. Growth pressure is adjusted in the range from 50 Torr to 300 Torr or around, and growth temperature is adjusted in the range from 1000° C. to 1200° C. or around. When the n-GaN layer is grown, $SiH_4$ gas which contains Si typically as an n-type impurity, is typically added at a predetermined flow rate to the source gas, to thereby dope Si into GaN.

Figure 2B:
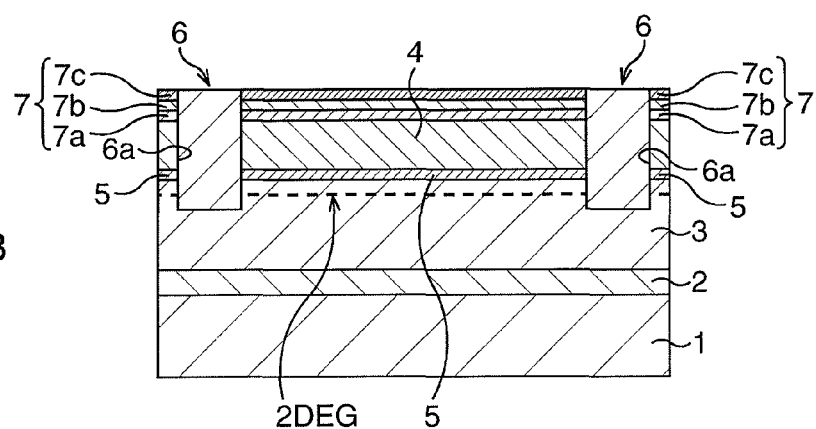

Next, as illustrated in FIG. 2B, device isolation structures 6 are formed by STI (Shallow Trench Isolation) process.

For more details, first, a resist mask, having openings in the regions correspondent to the device isolation structures formed later, is formed on the cap structure 7 by a lithographic process, and the isolation trenches 6a are formed so as to extend through the cap structure 7, the electron donor layer 4 and the intermediate layer 5, to as deep as partially removing the channel layer 3 from the top, by dry etching through the openings using a chlorine-containing gas.

The resist mask used in the dry etching is then removed typically by ashing.

Next, an insulating material, which is silicon oxide herein, is deposited over the third layer 7c typically by CVD, so as to fill the isolation trenches 6a. A portion of the deposited silicon oxide, which resides over the third layer 7c, is removed typically by CMP (Chemical-Mechanical Polishing), making use of difference in rate of polishing between n-GaN composing the third layer 7c of the cap structure 7 and silicon oxide. In this way, the device isolation structures 6 filling up the isolation trenches 6a may be formed. By the formation of the device isolation structures 6, an active region is defined on the cap structure 7.

Note that, in place of forming the isolation trenches 6a and of filling them up with the insulating material, a technique of implanting an impurity ion into the device isolation regions, so as to convert portions of the cap structure 7, the electron donor layer 4 and the channel layer 3 into insulating ones, may also be adoptable.

Figure 2C:
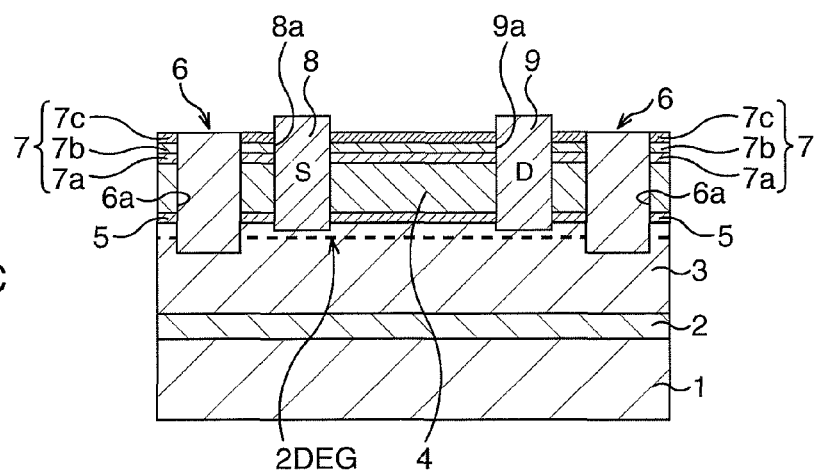

Next, as illustrated in FIG. 2C, a source electrode 8 and a drain electrode 9 are formed.

First, recesses 8a, 9a are formed in portions where the source electrode and the drain electrode will be formed later.

For more details, a resist mask, having openings in the regions correspondent to the source electrode and the drain electrode formed later, is formed on the cap structure 7 by a lithographic process, and the recess 8a, 9a are formed so as to extend through the cap structure 7, the electron donor layer 4, and the intermediate layer 5, to as deep as partially removing the channel layer 3 from the top (but to a depth shallower than 2DEG), by dry etching through the openings using a chlorine-containing gas.

Conditions of the dry etching, typically using chlorine gas as an etching gas, include a flow rate of 30 sccm, a pressure of 2 Pa, and an RF input power of 20 W. The depth of etching in this process is not specifically limited, and may be good enough if it allows formation of the recesses 8a, 9a which reach a predetermined depth in the channel layer 3.

The resist mask used for dry etching is removed typically by aching.

Next, an electrode material, Ti/Al typically used herein, is formed by a vacuum evaporation process and a lift-off process, so as to fill the recesses 8a, 9a while leaving the top portions of the electrode material projected out of the recesses 8a, 9a. The SiC substrate 1 is then annealed typically at around 550° C. In this way, a source electrode 8 and a drain electrode 9 are formed as a pair of ohmic electrodes.

Figure 3A:
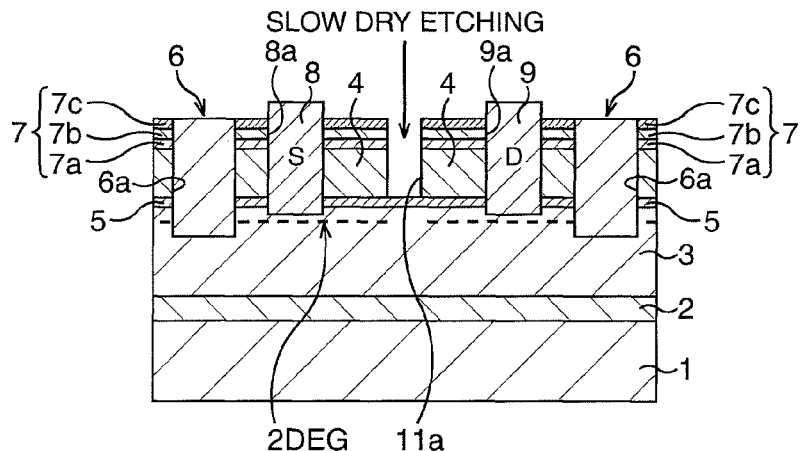

Next, as illustrated in FIG. 3A, a first opening 11a is formed in a portion where the gate electrode will be formed later, by dry etching using the intermediate layer 5 as an etching stopper.

For more details, a resist mask, having an opening in the region correspondent to the gate electrode formed later, is formed on the cap structure 7 by a lithographic process, and a portion where the gate electrode will be formed later is removed by dry etching through the opening using a chlorine-containing gas, and by using the intermediate layer 5 as an etching stopper. By these processes, an opening 11a which extends through the cap structure 7 and the electron donor layer 4, and allows a part of the surface of the intermediate layer 5 to expose therein, is formed. The dry etching is preferably carried out at a relatively low etchrate.

The resist mask used in the dry etching is then removed typically by ashing.

By using the intermediate layer 5 as an etching stopper, the opening 11a may be formed precisely to as deep as 26 nm or around, which corresponds to the total thickness of the cap structure 7 and the electron donor layer 4, and thereby the threshold voltage and current in the AlGaN/GaN FET may be controlled in a reliable manner.

Figure 3B:
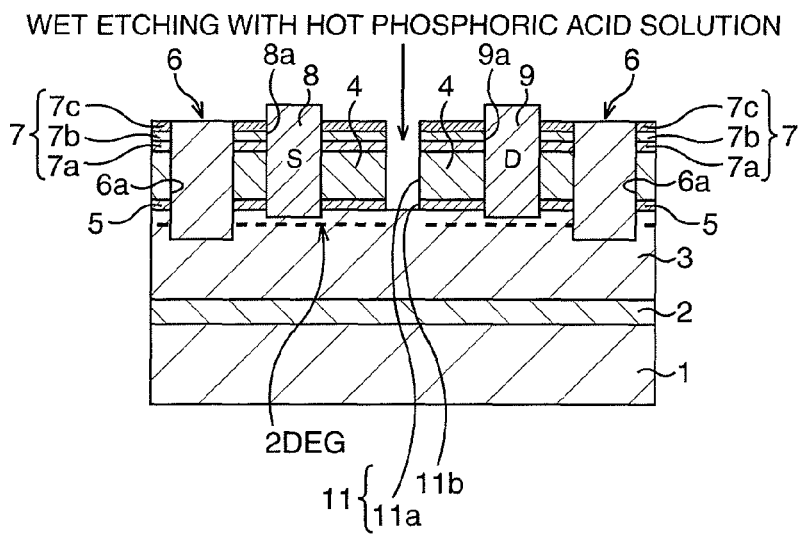

Next, as illustrated in FIG. 3B, an opening 11b is formed in the intermediate layer 5 in a portion positionally aligned with the opening 11a, by wet etching.

For more details, a portion of the intermediate layer 5 exposed to the bottom of the opening 11a is removed by wet etching, using a hot phosphoric acid solution. In this way, the opening 11b is formed in the intermediate layer 5 so as to allow therein a part of the surface of the channel layer 3 to expose through the opening 11a. The opening 11a and the opening 11b are formed so as to communicate with each other, to integrally give an opening 11.

In the wet etching using a hot phosphoric acid solution, AlN which composes the intermediate layer 5 can ensure a large etching selectivity with respect to the channel layer 3 composed of GaN. Accordingly, only a portion of the intermediate layer 5 exposes at the bottom of the opening 11a may be removed by etching, without etching the channel layer 3, and thereby the opening 11b is formed in the intermediate layer 5. The surface of the channel layer 3 exposed in the opening 11b shows an excellent surface morphology without etching damages, and an excellent smoothness on which the atomic layer steps may be observable.

The intermediate layer 5 is not only used as the etching stopper in the process of forming the opening 11 as described in the above, but also shows an operation of suppressing alloy scattering in the vicinity of the channel.

For the case where the intermediate layer 5 is not provided between the channel layer 3 and the electron donor layer 4 (as in the conventional normally-off AlGaN/GaN FET), AlGaN composing the electron donor layer 4 inevitably resides in the vicinity of the channel. Structure of AlGaN is based on a ternary system, and is therefore not considered to be excellent in the crystallinity. For this reason, the configuration suffers from a problem in that alloy scattering would occur in the vicinity of the channel, enough to degrade the carrier mobility in the AlGaN/GaN FET.

In contrast, provision of the intermediate layer 5 between the channel layer 3 and the electron donor layer 4 ensures presence of AlN, composing the intermediate layer 5, in the vicinity of the channel. Structure of
AlN is based on a binary system, and has therefore better crystallinity than the ternary system has. As a consequence, the alloy scattering in the vicinity of the channel may be suppressed, and thereby the carrier mobility may be improved to a large degree.

It may therefore be concluded from the discussion in the above, that the formation of the intermediate layer 5 between the channel layer 3 and the electron donor layer 4, using AlN (i-AlN) as a material therefor, and use of the intermediate layer 5 as an etching stopper in the process of formation of the opening 11, give the best way to obtain an excellent surface smoothness of the channel layer 3 exposed later, and to obtain a high carrier mobility through suppression of the alloy scattering.

For the purpose of suppressing the alloy scattering to thereby improve the carrier mobility, the intermediate layer 5 may preferably be formed to have a thickness of 1 nm to 2 nm or around. On the other hand, for the purpose of using the intermediate layer 5. as an etching stopper, the thickness may preferably be adjusted to 2 nm or around. Taking both purposes into consideration, the thickness of the intermediate layer 5 may preferably be adjustable in the range approximately from 1 nm to 2 nm (approximately 2 nm in this embodiment, as described in the above).

Figure 3C:
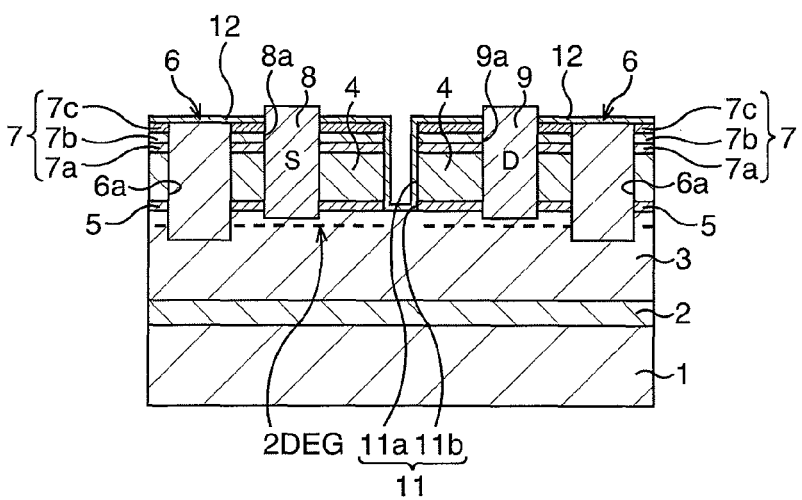

Next, as illustrated in FIG. 3C, a gate insulating film 12 is formed.

For more details, $Ta_2O_5$, for example, is deposited to as thick as approximately 5 nm to 100 nm, typically 20 nm or around herein, by CVD (Chemical Vapor Deposition) or ALD (Atomic Layer Deposition), over the cap structure 7 so as to cover the inner wall surface of the opening 11. Also $Al_2O_3$, $HfO_2$ and so forth may alternatively be adoptable as a material for composing the gate insulating film other than $Ta_2O_5$.

In this embodiment, the insulating material is deposited while alternately supplying a metal element source gas and an oxygen element source gas as the source materials. For an exemplary case of depositing $Ta_2O_5$, $Ta(NtBu)(NEt_2)_3$ (TBT-DET) is used as the metal element source, and $H_2O$ or $O_2$ is used as the oxygen element source. In this way, the gate insulating film 12 may be formed over the inner wall surface of the opening 11, so as to have a uniform thickness (for example, so as to adjust difference of thickness between the thickest portion on the bottom surface and the thinnest portion on the side faces to 5% or smaller).

Since the gate insulating film 12 directly covers the bottom surface of the opening 11 having an excellent surface smoothness as described in the above, so that also the gate insulating film 12 per se may have an excellent surface smoothness. The surface of the channel layer 3, which composes the bottom of the opening 11, was confirmed to show atomic layer steps even in the state covered with the gate insulating film 12, enough to prove the smoothness having been attained before being covered.

As may be understood from the above, the gate insulating film 12 ensures an excellent level of breakdown voltage while being formed with a uniform thickness, and ensures variation-free transistor characteristics while being formed with a high level of smoothness at the bottom of the opening 11 (which defines the gate length).

Figure 4A:
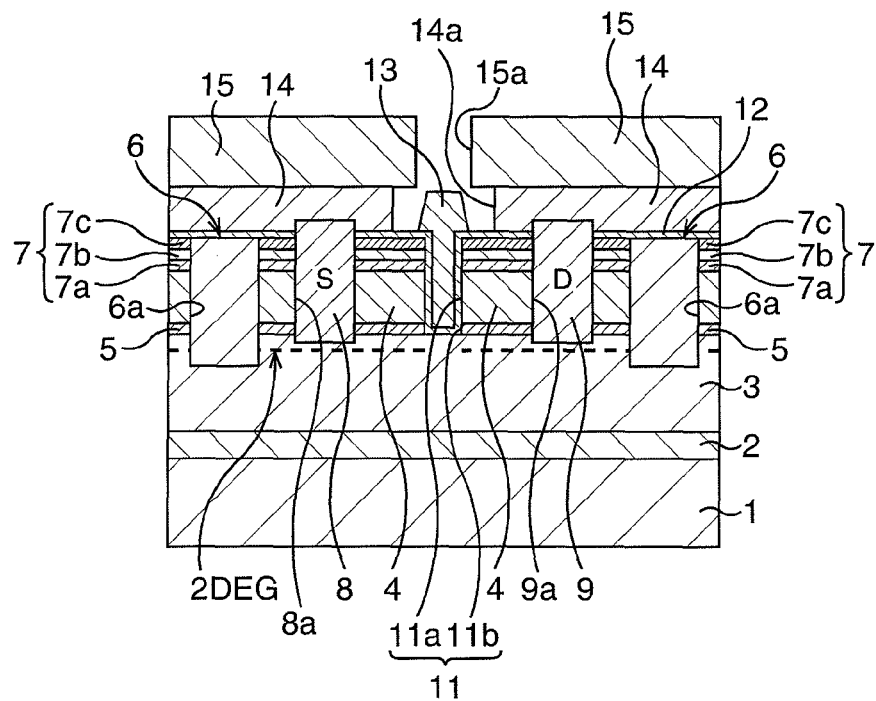
Figure 4B:
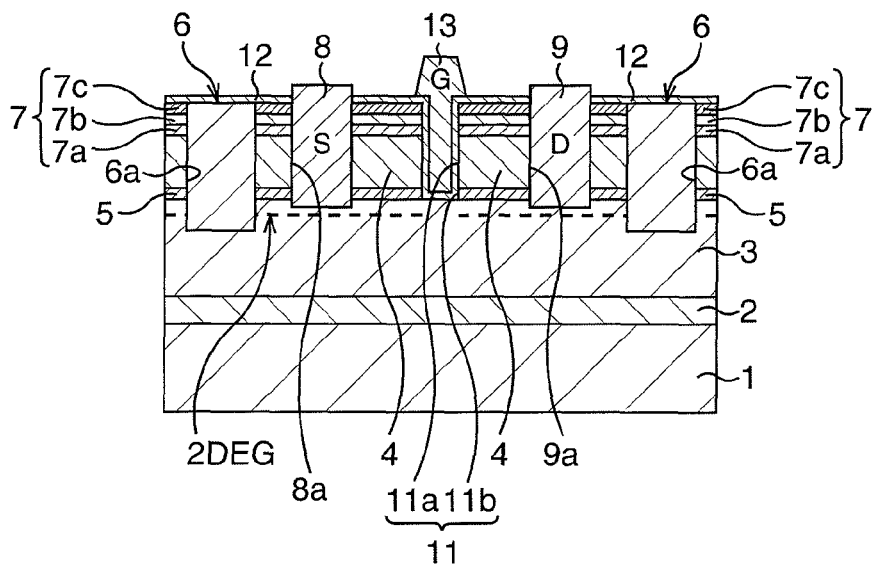

Next, as illustrated in FIGS. 4A, 4B, a gate electrode 13 is formed.

For more details, first as illustrated in FIG. 4A, a lower resist layer 14 (for example, under a trade name of PMGI, from MicroChem Corporation, USA), and an upper resist layer 15 (for example, under a trade name of PFI32-A8, from Sumitomo Chemical Co., Ltd.) are respectively formed by spin coating. An opening 15a having a diameter of approximately 0.8 μm is then formed in the upper resist layer 15 by ultraviolet exposure.

Next, the lower resist layer 14 is etched by wet etching using an alkaline developer solution, while using the upper resist layer 15 as a mask. By the etching, an opening 14a larger than the opening 15a is formed in the lower resist layer 14, so as to give a penthouse-like structure as illustrated in the drawing.

Next, a gate-forming metal layer (Ni: approximately 10 nm thick/Au: approximately 300 nm thick) is formed over the entire surfaces of the openings 15a, 14a by vacuum evaporation, while using the upper resist layer 15 and the lower resist layer 14 as a mask. Note that a portion of the gate-forming metal layer deposited on the upper resist layer 15 is not illustrated herein for simplicity of illustration.

Thereafter, as illustrated in FIG. 4B, the lower resist layer 14 and the upper resist layer 15 are removed, together with the portion of the gate-forming metal layer deposited on the upper resist layer 15, using a warm organic solvent. In this way, the gate electrode 13 composed of Ni/Au is formed so as to fill up the opening 11 while placing the insulating film 12 in between.

The AlGaN/GaN FET is completed further by going through processes including formation of insulating interlayer and interconnects.

Various effects of the AlGaN/GaN FET this embodiment, examined based on comparison with those of the conventional AlGaN/GaN FET having a gate-recess structure, will be explained below. The AlGaN/GaN FET, having the gate recess structure to be compared with this embodiment, is configured to have a gate electrode formed by filling an opening, formed in an AlGaN electron donor layer, with an electrode material without preliminarily forming an intermediate layer. The thus-configured conventional AlGaN/GaN FET is now denoted as Sample 1, and the AlGaN/GaN FET of this embodiment is denoted as Sample 2.

Figures 5A, 5B:
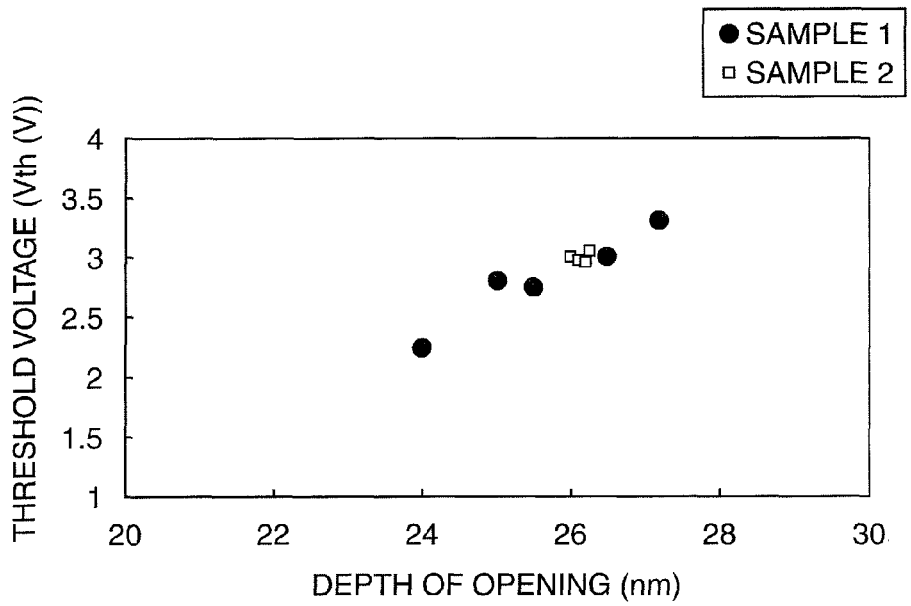
FIGS. 5A and 5B are drawings illustrating results of investigation into relation between the depth of openings formed by etching at positions where gate electrodes will be formed later, and the threshold voltage.

Results of investigation into relation between the depth of the opening formed by etching at a position where an electrode will be formed later, and the threshold voltage are illustrated in FIGS. 5A, 5B. FIG. 5A is a characteristic drawing, and FIG. 5B is a table compiling the results represented in FIG. 5A.

Sample 1 is found to show a large variation in the depth of opening formed therein, due to absence of the intermediate layer. In this case, variation in the depth (difference of depth between the most-deeply-formed opening and the most-shallowly-formed opening) was found to be 3 nm. Accordingly, also the threshold voltage was found to vary. Variation in the threshold voltage (difference of threshold voltage between the AlGaN/GaN FETs having the most-deeply-formed opening and the most-shallowly-formed opening) was found to be 1 V.

In contrast, the openings (represented by the opening 11a, herein) in Sample 2 were formed to have a nearly constant depth without variation, by virtue of the intermediate layer 5 which functions as an etching stopper layer. Variation in the depth in this case was found to be 0.2 nm. Accordingly, also the threshold voltage was found to show almost no variation, only with a variation in the threshold voltage of 0.06 V.

Figure 6:
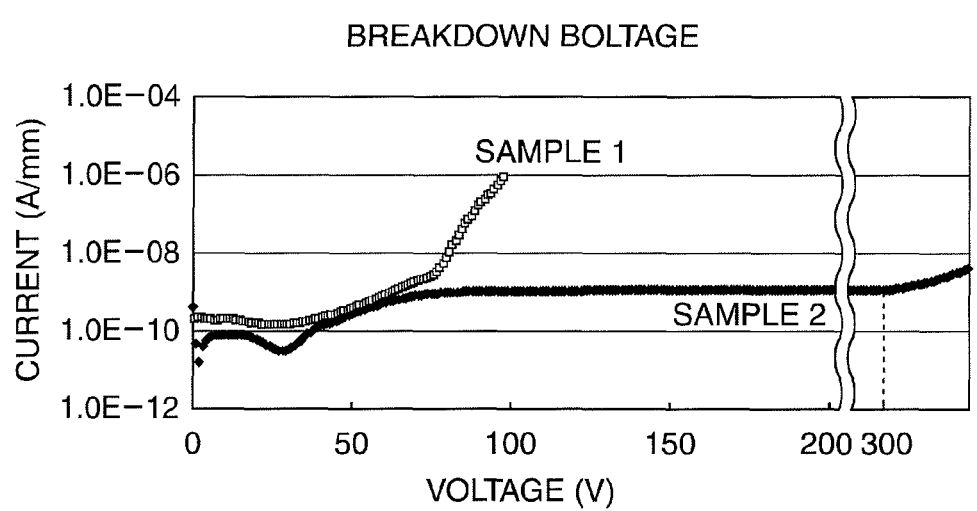
FIG. 6 is a characteristic drawing illustrating results of investigation into relation between applied voltage and output current of AlGaN/GaN FET.

Results of investigation into relation between applied voltage and output current of the AlGaN/GaN FET are illustrated in FIG. 6.

Sample 1 is found to show a sharp increase in the output current at around an applied voltage of 70 V, proving the breakdown voltage of 70 V or around.

In contrast, Sample 2 is found to show an almost constant current value up to an applied voltage of 300 V or around, and a slight increase in the current value at an applied voltage of approximately 320 V or higher. From the results, the breakdown voltage is found to be 300 V or higher (at least 300 V).

In this way, the AlGaN/GaN FET of this embodiment was confirmed to more stably show a constant threshold value as compared with the conventional AlGaN/GaN FET, and to ensure higher breakdown voltage. It was also confirmed that the AlGaN/GaN FET of this embodiment has the breakdown voltage extremely higher than that of the conventional AlGaN/GaN FET, and ensures stable operation.

As has been explained in the above, according to this embodiment, a highly-reliable compound semiconductor device, capable of stabilizing the threshold voltage with a small variation, and attaining a sufficient level of breakdown voltage, maybe obtained, while adopting the gate recess structure to enable the normally-off operation.

(Second Embodiment)

This embodiment will disclose, similarly to the first embodiment, a compound semiconductor device having a geometry of the gate electrode different from that in the first embodiment.

FIGS. 7A to 9B are schematic sectional views sequentially illustrating processes of a method of manufacturing a compound semiconductor device according to a second embodiment. Note that all constituents similar to those in the first embodiment will be given the same reference numerals, and will not repetitively be detailed.

Figure 7A:
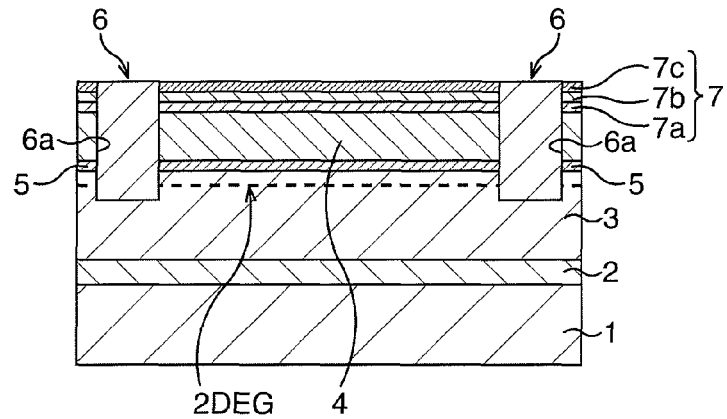
FIGS. 7A, 7B, 7C, 8A, 8B, 8C, 9A and 9B are schematic sectional views sequentially illustrating processes of a method of manufacturing a compound semiconductor device according to a second embodiment.

In this embodiment, the processes similar to those explained in the first embodiment referring to FIGS. 2A, 2B are carried out to obtain a state illustrated in FIG. 7A, which is similar to FIG. 2B.

Figure 7B:
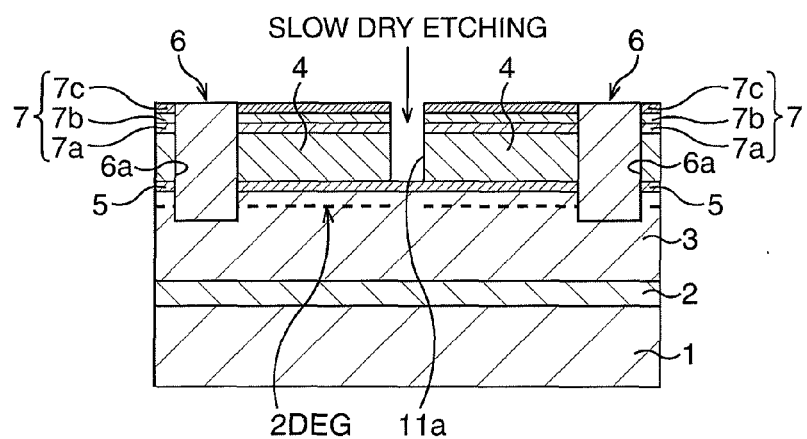

Next, as illustrated in FIG. 7B, similarly to as described in the first embodiment referring to FIG. 3A, the first opening 11a is formed by dry etching, using the intermediate layer 5 as an etching stopper, at a position where the gate electrode will be formed later.

By using the intermediate layer 5 as an etching stopper, the opening 11a may be formed precisely to as deep as 26 nm or around, which corresponds to the total thickness of the cap structure 7 and the electron donor layer 4, and thereby the threshold voltage and current in the AlGaN/GaN FET may be controlled in a reliable manner.

Figure 7C:
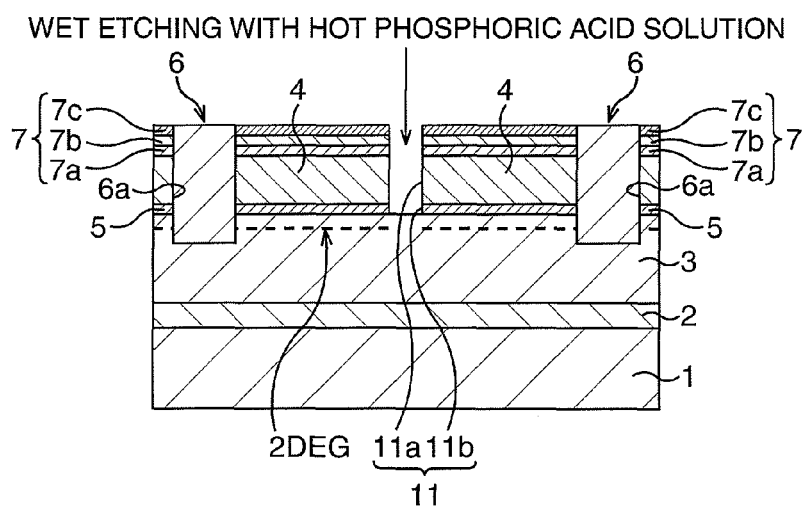

Next, as illustrated in FIG. 7C, an opening 11b is formed in the intermediate layer 5 in a portion positionally aligned with the opening 11a, by wet etching, similarly to as described in the first embodiment referring to FIG. 3B. The opening 11a and the opening 11b are formed so as to communicate with each other, to integrally give an opening 11.

In the wet etching using a hot phosphoric acid solution, AlN which composes the intermediate layer 5 can ensure a large etching selectivity with respect to the channel layer 3 composed of GaN. Accordingly, only a portion of the intermediate layer 5 which exposes at the bottom of the opening 11a may be removed by etching, without etching the channel layer 3, and thereby the opening 11b is formed in the intermediate layer 5. The surface of the channel layer 3 exposed in the opening 11 shows an excellent surface morphology without etching damages, and an excellent smoothness on which the atomic layer steps may be observable.

The formation of the intermediate layer 5 between the channel layer 3 and the electron donor layer 4, using AlN (i-AlN) as a material therefor, and use of the intermediate layer 5 as an etching stopper in the process of formation of the opening 11, give the best way to obtain an excellent surface smoothness of the channel layer 3 exposed later, and to obtain a high carrier mobility through suppression of the alloy scattering.

Figure 8A:
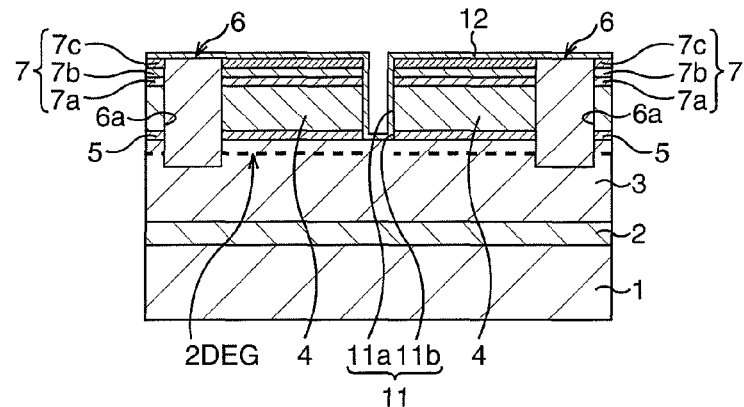

Next, as illustrated in FIG. 8A, the gate insulating film 12 is formed similarly to as described referring to FIG. 3C.

The gate insulating film 12 may be formed over the inner wall surface of the opening 11, so as to have a uniform thickness (for example, so as to adjust difference of thickness between the thickest portion on the bottom surface and the thinnest portion on the side faces to 5% or smaller).

Since the gate insulating film 12 directly covers the bottom surface of the opening 11 having an excellent surface smoothness as described in the above, so that also the gate insulating film 12 per se may have an excellent surface smoothness. The surface of the channel layer 3 which composes the bottom of the opening 11, was confirmed to show atomic layer steps even in the state covered with the gate insulating film 12, enough to prove the smoothness having been attained before being covered.

As may be understood from the above, the gate insulating film 12 ensures an excellent level of breakdown voltage while being formed with a uniform thickness, and ensures variation-free transistor characteristics while being formed with a high level of smoothness at the bottom of the opening 11 (which defines the gate length).

Figure 8B:
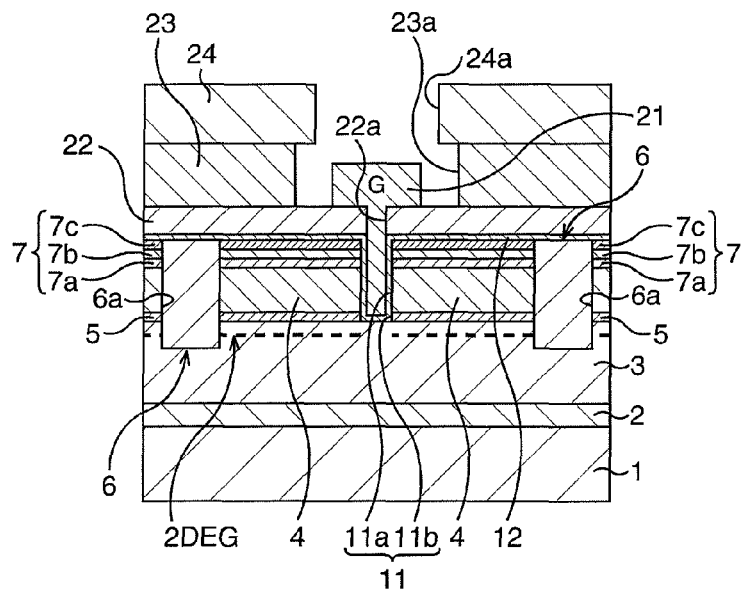
Figure 8C:
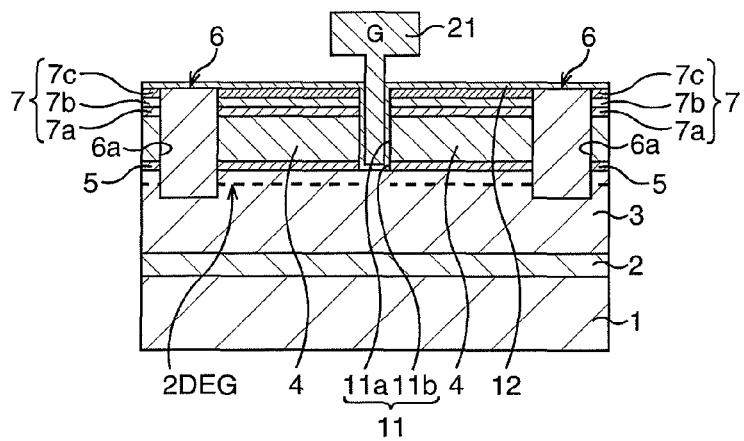

Next, as illustrated in FIGS. 8B, 8C, a gate electrode 21 is formed.

For more details, first as illustrated in FIG. 8B, a positive electron beam-curable resist (under a trade name of ZEP520-A17, from ZEON Corporation) is coated by spin coating to form a fine-gate-forming resist layer 22 to as thick as 300 nm or around, and annealed at 180° C. for 5 minutes.

Next, an alkali-soluble resin (under a trade name of PMGI, from MicroChem, USA) is coated by spin coating to as thick as 500 nm or around, to thereby form a lower resist layer 23, and annealed at 180° C. for 3 minutes.

Next, on the lower resist layer 23, a positive electron beam-curable resist (under a trade name of
ZEP520-A17, from ZEON Corporation) is coated by spin coating to form an upper resist layer 22 to as thick as 200 nm or around, and then annealed at 180° C. for 2 minutes.

Next, by electron beam lithography, the upper resist layer 24, the lower resist layer 23, and the fine-gate-forming resist layer 22 are patterned. By this process, a narrow opening 22a through which a portion of the gate electrode having a hammer-handle-like cross section will be formed later is formed in the fine-gate-forming resist layer 22, and wide openings 23a, 24a through which a portion of the gate electrode having a hammerhead-like cross section will be formed later, are respectively formed in the lower resist layer 23 and the upper resist layer 24.

Next, a gate-forming metal layer (Ni: approximately 10 nm thick/Au: approximately 300 nm thick) is deposited by vacuum evaporation over the entire surface including the inner portions of the openings 24a, 23a, 22a, using the upper resist layer 24, the lower resist layer 23, and the fine-gate-forming resist layer 22 as a mask. Note that a portion of the gate-forming metal layer deposited on the upper resist layer 24 is not illustrated herein for simplicity of illustration.

Thereafter, as illustrated in FIG. 8C, the upper resist layer 24, the lower resist layer 23, and the fine-gate-forming resist layer 22 are removed, together with a portion of the gate-forming metal layer deposited on the upper resist layer 24, using a warm organic solvent. In this way, the gate electrode 13 composed of Ni/Au, having a mushroom-like geometry, is formed so as to fill up the opening 11 while placing the insulating film 12 in between, and so as to project above the edge of the opening 11, showing a hammerhead-like cross section as a whole.

By forming the gate electrode 21 so as to have the mushroom-like geometry, characterized by a larger-diameter head (cap) and a smaller-diameter bottom (stem), the AlGaN/GaN FET excellent in the electrical characteristics may be obtained.

Figure 9A:
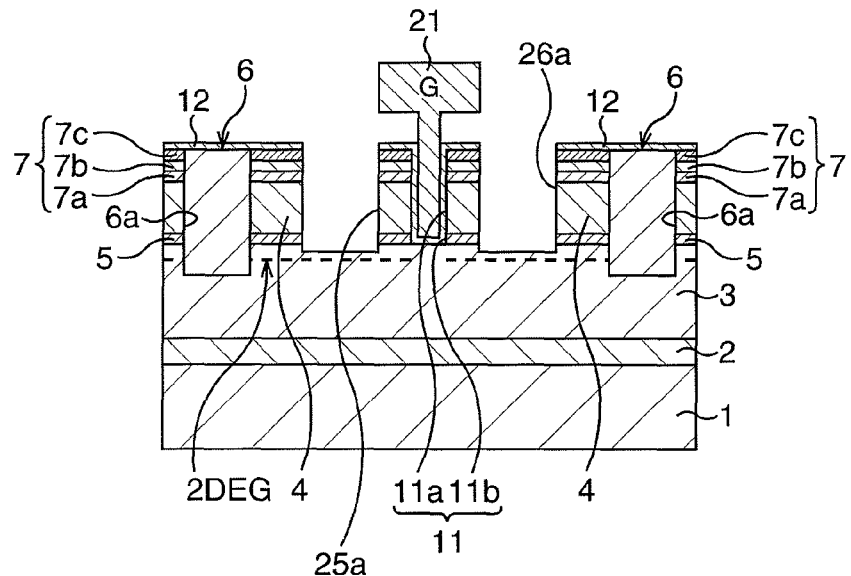

Next, as illustrated in FIG. 9A, recesses 25a, 26a are formed at positions where the source electrode and the drain electrode will be formed later.

For more details, a resist mask, having openings in the regions correspondent to the source electrode and the drain electrode formed later, is formed on the cap structure 7 by a lithographic process, and the recess 25a, 26a are formed so as to extend through the cap structure 7, the electron donor layer 4, and the intermediate layer 5, to as deep as partially removing the channel layer 3 from the top (but to a depth shallower than 2DEG), by dry etching through the openings using a chlorine-containing gas. In this embodiment, one sides (the gate electrode 21 sides) of the recesses 25a, 26a are etched in a self-aligned manner with respect to the gate electrode 21, without using the resist mask.

Conditions of the dry etching, typically using chlorine gas as an etching gas, include a flow rate of 30 sccm, a pressure of 2 Pa, and an RF input power of 20 W. The depth of etching in this process is not specifically limited, and may be good enough if it allows formation of the recesses 25a, 26a which reach a predetermined depth in the channel layer 3.

The resist mask used for dry etching is removed typically by asking.

Figure 9B:
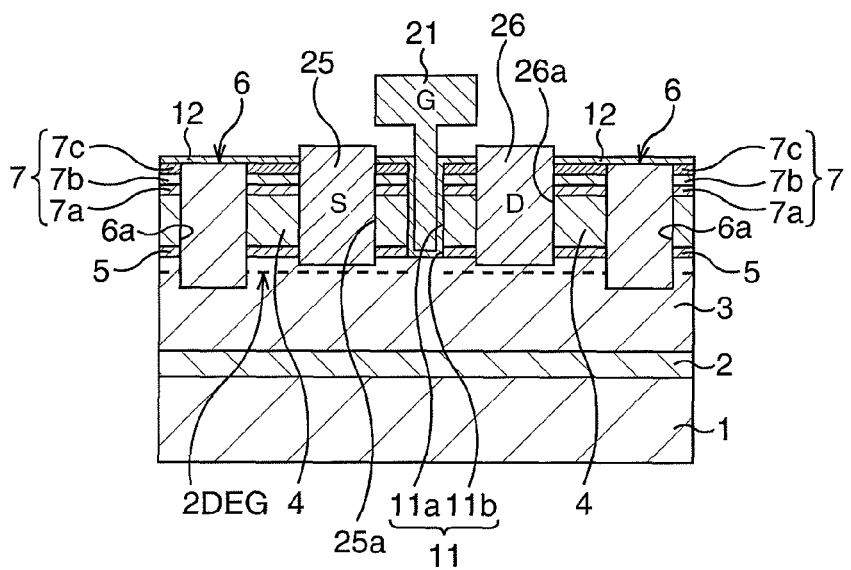

Next, as illustrated in FIG. 9B, the source electrode 25 and the drain electrode 26 are formed.

For more details, an electrode material, Ti/Al typically used herein, is formed by a vacuum evaporation process and a lift-off process, so as to fill the recesses 25a, 26a while leaving the top portions of the electrode material projected out of the recesses 25a, 26a. The SiC substrate 1 is then annealed typically at 550° C. or around. In this way, the source electrode 25 and the drain electrode 26 are formed as a pair of ohmic electrodes.

In this embodiment, portions of the recesses 25a, 26a, in which the source electrode 25 and the drain electrode 26 will be formed later, are formed in a self-aligned manner. In this process, distance between the source electrode 25 and the drain electrode 26 is determined by the width of the head (mushroom-like cap) of the gate electrode 21. Since the distance is relatively short, so that the AlGaN/GaN FET attainable herein is capable of high-speed operation. On the other hand, degradation in the breakdown voltage may be encountered due to formation of the source electrode 25 and the drain electrode 26 in a self-aligned manner. However, in this embodiment, the intermediate layer 5 composed of an i-GaN layer is disposed between the channel layer 3 and the electron donor layer 4, and the gate insulating film 12 is formed in a uniform and smooth manner. By virtue of the configuration, the breakdown voltage may be improved to a large degree. As a consequence, the degradation in the breakdown voltage ascribable to the self-aligned formation of the source electrode 25 and the drain electrode 26 may be almost negligible relative to the large degree of improvement, and may therefore be not problematic.

Thereafter, the AlGaN/GaN FET is completed further by going through processes including formation of insulating interlayer and interconnects.

As has been explained in the above, according to this embodiment, a highly-reliable AlGaN/GaN FET, capable of stabilizing the threshold voltage with a small variation, attaining a sufficient level of breakdown voltage, and ensuring high-speed operation, may be obtained, while adopting the gate recess structure to enable the normally-off operation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A method of manufacturing a compound semiconductor device comprising:
    forming a channel layer containing a Group III-V nitride semiconductor;
    forming an AlN layer over the channel layer;
    forming an electron donor layer containing a Group III-V nitride semiconductor over the AlN layer;
    forming a first opening in the electron donor layer so as to allow the AlN layer to expose therein;
    forming a second opening in the AlN layer through the first opening so as to allow the channel layer to expose therein; and
    forming a gate electrode over the channel layer, so as to fill the first opening and the second opening.

2. The method of manufacturing a compound semiconductor device according to claim 1,
    wherein the first opening is formed in the electron donor layer by dry etching, and
    the second opening is formed in the AlN layer by wet etching.

3. The method of manufacturing a compound semiconductor device according to claim 2,
    wherein the second opening is formed by wet etching using a phosphoric acid solution.

4. The method of manufacturing a compound semiconductor device according to claim 1, further comprising:
    forming a gate insulating film so as to cover at least the inner wall surfaces of the first opening and the second opening;
    wherein the gate electrode is formed so as to fill the first opening and the second opening, while placing the gate insulating film in between.

5. The method of manufacturing a compound semiconductor device according to claim 4,
    wherein the gate insulating film is formed by PE-CVD process or ALD process.

6. The method of manufacturing a compound semiconductor device according to claim 1, further comprising:
    stacking a first AlGaN layer, a second AlGaN layer, and a third AlGaN layer over the channel layer;
    wherein the second AlGaN layer has an Al content larger than that in the first AlGaN layer and the third AlGaN layer.

7. The method of manufacturing a compound semiconductor device according to claim 1,
    wherein the AlN layer is formed to have a thickness of 1 nm or larger and 2 nm or smaller.

8. The method of manufacturing a compound semiconductor device according to claim 1,
    wherein the gate electrode is made wider in width in a portion thereof projected above the channel layer, than in a portion filled in the first opening and the second opening, so as to give a hammerhead-like cross section.

* * * * *